United States Patent [19]

Faile

[11] 4,282,057

[45] Aug. 4, 1981

[54] VAPOR GROWTH OF MERCURY IODIDE FOR USE AS HIGH ENERGY DETECTORS

[75] Inventor: Samuel P. Faile, Cincinnati, Ohio

[73] Assignee: Purdue Research Foundation, West Lafayette, Ind.

[21] Appl. No.: 125,157

[22] Filed: Feb. 27, 1980

[51] Int. Cl.³ .............................................. C30B 29/12
[52] U.S. Cl. .................................. 156/614; 156/610; 156/DIG. 82; 423/491
[58] Field of Search ............... 156/DIG. 82, 610, 613, 156/614, 603; 423/491; 23/305 R; 148/174, 175

[56] References Cited

U.S. PATENT DOCUMENTS

| | | | |
|---|---|---|---|
| 3,386,866 | 6/1968 | Ebert et al. | 156/613 |
| 3,969,182 | 7/1976 | Carlston | 423/491 |
| 4,030,964 | 6/1977 | Schieber et al. | 156/DIG. 82 |

FOREIGN PATENT DOCUMENTS 2006778  9/1971  Fed. Rep. of Germany ... 156/DIG. 82

*Primary Examiner*—Frank W. Lutter
*Assistant Examiner*—Gregory N. Clements
*Attorney, Agent, or Firm*—John R. Nesbitt; Robert E. Harris

[57] ABSTRACT

The low temperature red form of mercuric iodide is grown by a chemical transport method which introduces organic monomers or polymers during the crystal growth process. Resulting crystals are in the form of platelets which are more directly useful in radiation detector device applications. Platelets near one centimeter in width and 200 μm in thickness have been grown in periods of a few days using only 99.9% (unpurified) starting material.

14 Claims, 6 Drawing Figures

VAPOR GROWTH OF MERCURY IODIDE FOR USE AS HIGH ENERGY DETECTORS

The Government has rights in this invention pursuant to Grant No. NSF-MRL DMR77-23798 awarded by the National Science Foundation.

BACKGROUND OF THE INVENTION

Mercuric iodide ($HgI_2$) has in the past been grown using various techniques such as from acetone or DMSO solutions, as disclosed in U.S. Pat. No. 3,969,182, by recrystallization from the high temperature yellow orthorhombic to the low temperature red tetragonal form, as disclosed in U.S. Pat. No. 3,941,648, and by vapor transport, such as disclosed in U.S. Pat. No. 4,030,964. The many problems associated with the known state-of-the-art are described in the aforesaid patents.

The purpose of the present invention is to suppress some of the effects of impurities in crystals and, in some instances, to obtain platelets rather than relatively thick crystals such as described in the prior art.

SUMMARY OF THE INVENTION

This invention teaches that polymer controlled crystal growth is a simple way to grow high quality $HgI_2$ platelets with electrical properties suitable for nuclear radiation detectors. The great importance is that the method does not require the use of high purity starting material or the many purification steps now in use, and grows crystals of the required size quickly.

At the present time, the mechanism for formation of the platelets is not known. Apparently a polymer that is transporting, forming, and disassociating in the environment of crystal growth is important.

One object of this invention is to provide a fast, low cost, method of growing $HgI_2$ crystals for use in radiation detectors.

Another object of this invention is to produce an $HgI_2$ crystal having a high resolution capacity when used in a detector.

Another object of this invention is to produce a very thin (platelet) crystal of $HgI_2$ for detector use so that the normal mechanical slicing or grinding and polishing operations performed on prior known $HgI_2$ crystals are made unnecessary.

Other objects of the invention will be apparent from the following description and drawings.

DESCRIPTION OF THE PREFERRED EMBODIMENTS

The platelet crystals produced by the present invention are produced from relatively impure reagent grade material. The method of crystal growth here proposed provides crystals that are not darkened by impurities and such crystals can be used as high energy detectors.

The present invention makes use of an ingredient, or organic transport material, during crystal formation, that presents a polymer and removes the harmful effects of some impurities from the crystals formed while at the same time enhances some of the desirable properties of these same crystals.

Frequently when $Hg_2Cl_2$, $Hg_2Br_2$, and $Hg_2I_2$ is produced the crystals have a smokey or brownish tinge. By using the process of this invention the smokey appearance of the crystals can often be removed. One early embodiment of this invention involves the use of generally less than 1% by weight of CN containing compounds such as $Hg(SCN)_2$ and $NH_4SCN$ which is sealed in a capsule with the source material that is to be used for crystal growth. If the temperature of growth is not too high being generally less than 500° C., the desired results are achieved as $(CN)_n$ polymer forms which is very stable and reduces the volatility of some other materials which become bound to it. This frequently involves enhanced retention of a dark residue of impurities that do not reach the deposition zone as easily. For wide band gap materials this is more easily seen. For the sublimation of $Hg_2Cl_2$ of the hot source end at 400° C. is retained a rubbery darkened vessiculated mass of material while the deposition region where the crystals grow had a much higher proportion of crystals that were completely colorless.

Frequently when the CN containing compounds are used, such as for HgS, $HgI_2$, and $Hg_2Cl_2$, the crystals are flat and more easily used as detectors and as specimens for optical studies than would be the case if grinding and polishing were needed to produce flat surfaces from polyhedra. It is believed that some of the $(CN)_n$ polymer reaches the site of the crystals and in some way directs the growth in a planar direction.

Crystals of $HgI_2$ with increased organic content seem to have better electronic hole mobility. It may be that the layers of the pseudo luminar structure of $HgI_2$ are pinned together by organics which improves the mobility.

The present process deliberately introduces organic impurities into the system such as CN groups that would conventionally be considered harmful. But, on the contrary, as the experimental results hereafter detailed show, the effects are beneficial.

EXAMPLE I

Growth of $HgI_2$ Platelets in the Presence of CN Groups

Figure 1:
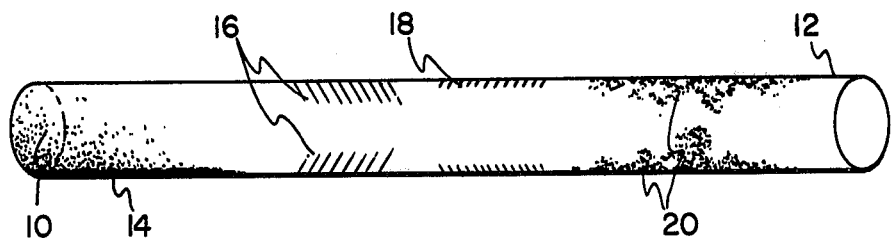
FIG. 1 is a diagramatic view of apparatus used to produce the crystals of Example I of this invention.

Five grams of mercuric iodide were sealed in an evacuated 18 mm ID fused quartz tube about 7" long with this analytical reagent made by Mallinckrodt was sealed 20 mg of $NH_4SCN$ and 25 mg of $Hg(SCN)_2$. The hot end of the tube containing the chemicals was kept at 230° C. while the cool end was maintained at room temperature. After running overnight the run was removed from the furnace. There were a few crystals of the red low temperature form which had a flat morphology. The apparatus used to form these crystals is shown in FIG. 1, wherein the original source material 10 is shown at the left end of quartz tube 12. Crystals about 2–3 mm wide and about 1/10 of a mm thick were produced by the above process.

A black residue 14 was left behind in the tube after completion of the process. The high temperature form of the crystals is indicated at 16, and the low temperature form is indicated at 18. A yellow deposit residue was left as indicated at 20. The original source material at the left end of the tube was subjected to the 230° C. temperature while the right end of the tube was at room temperature.

EXAMPLE II

Large $HgI_2$ platelets are grown using styrene. About 1% by weight of styrene is sealed in a capsule with $HgI_2$. The source end with the materials is subjected to about 230° C. while the other end of the tube is maintained at near room temperature. Within a day, more of the red platelets have formed than when $NH_4SCN$ is used. To obtain large platelets up to a cm wide or more rather than 2 to 3 mm across, a procedure has been developed which does not require any more materials.

This procedure involves heating most of the tube and what was previously the room temperature end at 230° C. and the source end at about 150° C. for a few hours by changing the position of the tube in the furnace. This is done after a day of normal crystal growth. This causes the $HgI_2$, styrene, and some of the polystyrene to move back to the source end where more polystyrene forms. The tube is then run again with the source end at 230° C. and the other end at room temperature. This time larger red $HgI_2$ platelets form below 127° C. This cycle is repeated a few times and then the final growth is undertaken for a couple of days or more where crystals larger than 1 cm wide can be obtained.

EXAMPLE III

In this experiment, $HgI_2$ Mallinckrodt powder 99.9% pure was sealed in an evacuated, fused quartz tube with about 1% by weight or less styrene or polyethylene. Typical dimensions of the capsule were 22 mm ID and a length of eight inches. Contained in the capsule were 25 gr $HgI_2$ powder and about 250 mg of the styrene liquid.

The source containing the powder is placed at 230° C. while the other end of the capsule is placed at near room temperature. This is done after any powder in the deposition regions of the tube has been removed by heating the tube in these areas to evaporate the $HgI_2$ so as to remove excessive nucleation sites. In a few days a few platelets of the low temperature form of $HgI_2$ will have formed below 127° C., 2–3 mm wide, and up to one-half mm thick. However, if a high yield of wide platelets is desired, the source end should be heated near 150° C. and the rest of the tube at 230° C. for a few hours or more. This treatment removes any crystals from the deposition zones and also allows a more thorough reaction resulting in some polystyrene formation at the source end. This polystyrene, during subsequent chemical vapor transport, will slowly evaporate and apparently enhance the platelet growth. In any event, after a few gradient changes it is possible to then have the source end at 230° C. and the other end at near room temperature and obtain a platelet of the red $HgI_2$ form exceeding 1 cm wide and being over 200 microns thick.

Figure 3:
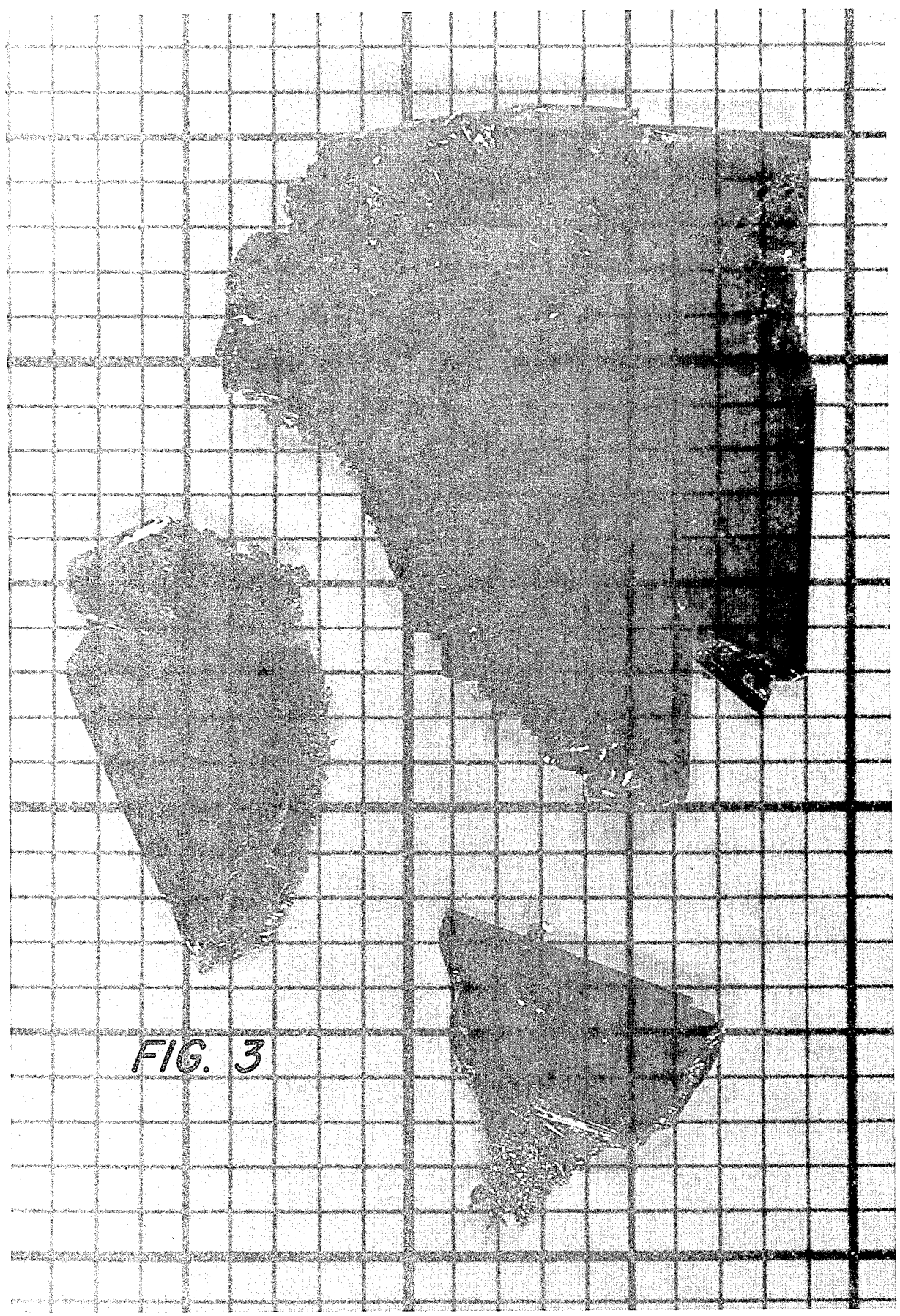
FIG. 3 is a photograph of some platelet crystals showing their crystalline structure and produced per Example II of this invention, the platelets being on a millimeter lined background.

Many more platelets about 0.5 cm wide also form in about two days. Shown in FIG. 3 are some platelets against a millimeter lined paper background. The damage seen in the largest crystal was produced during opening of the capsule when air rushed in, and was avoided in a later run.

Figure 4:
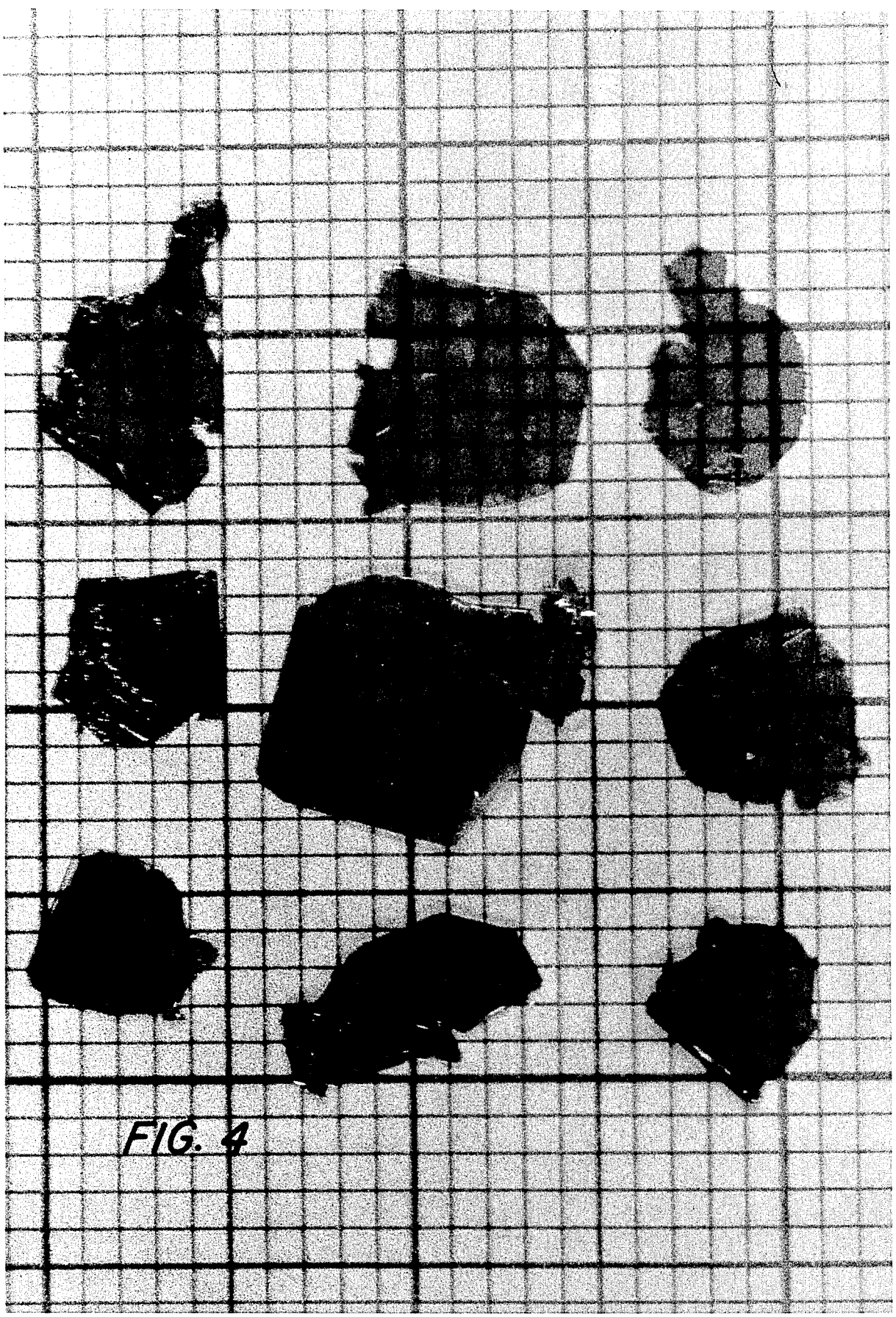
FIG. 4 is a photograph of more platelet crystals showing their crystalline structure and produced in a manner similar to Example II, but wherein polyethylene was used in the starting material rather than styrene.

In FIG. 4 are shown more $HgI_2$ crystals that were produced in a similar manner but polyethylene was used in the starting material rather than styrene. This is easier since the polyethylene film is easier to measure and seal in a tube without silicon carbide formation interfering with the sealing of the tube. With the polymer already formed there is an ample supply at the source end even after heating the whole tube in the range from 150° C. to 230° C. to react the ingredients. In this run, whose crystal growing portion lasted 40 hours, 80% of the polymer still remained near the source end at 230° C. Presumably this run involving the use of an 18 mm ID tube with 15 gr of $HgI_2$ and 150 mg of polystyrene, if of longer duration, would have produced even larger and more numerous platelets.

TEST RESULTS

The Goal

Estimating the feasibility of using obtained crystals as low energy gamma and x-ray detectors for spectrometry.

Detector Fabrication

Detectors were prepared by painting Aquadaq contacts on both sides of the sample. Au wires were used as leads. After drying for 60 minutes in air, the sample was sprayed with Humiseal and air dried overnight.

Two detectors of $HgI_2$ and one detector of HgS were prepared.

Leakage Current Determination

Crystals are strongly photo-conductive. Detectors exhibit dark leakage current which decrease with time after initial application or increase of bias. Detectors have required slow increments of 5 to 10 volts over periods of about one-half minute.

| Results |
|---|
| 1. $HgI_2$ Purdue JG-1 (produced by the method described in Example I): thickness ~ 100μm, active area ~ 2mm² |

| | | | | | |
|---|---|---|---|---|---|
| volts | 10 | 50 | 100 | after | 100v |
| pA | 1.2 | 20 | 40 | 5 min | 20 pA |

| 2. $HgI_2$ Purdue JG-2 (produced by the method described in Example I): thickness ≤ 100 μm, active area ~ 4mm² |
|---|

| | | | | | |
|---|---|---|---|---|---|
| volts | 10 | 50 | 100 | after | 100v |
| pA | 2.6 | 17 | 34 | 5 min | 30 pA |

X-ray Measurements with $HgI_2$ Detectors

Figure 2:
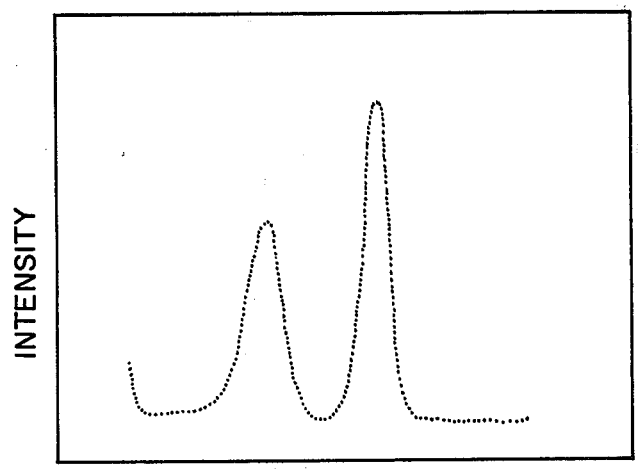
FIG. 2 is a graphic representation of the electrical characteristics of a crystal produced per Example I of this invention.

The response of the detectors to x-ray radiation was measured using Fe-55 source (5.9 keV x-rays). The result obtained with $HgI_2$ Purdue JG-1 is shown in FIG. 2. The energy resolution of Fe-55 peak is 1.2 keV (FWHM). The electronic noise measured as a width of the line of the pulser attached to the input of the system through small (0.2 pF capacity, is 950 eV/FWHM). The energy resolution of the system without detector was 320 eV (FWHM), which means that for these measurements, the degradation of the resolution due to electronics connected to the detector is negligible.

The result obtained with the other detector (JG-2) is slightly worse (not shown).

Comments

Leakage current observed in measured detectors is still somewhat higher than usually obtained with good $HgI_2$ detectors. The reason could be the lower resistivity of the crystal. It is also possible, that it is dominated by surface leakage current—because of minute size of the platelets the samples were not etched as is usually done in detector fabrication. Also, because of thinness of the samples the capacity of the detectors is relatively high. Both values of current and capacity cause the increase of electronic noise which is reflected as a larger value of FWHM of the pulser and, consequently, degrading the x-ray spectrum.

Our earlier work as involved the growth of $HgI_2$ platelets, HgS cinnabar platelets, and $Hg_2Br_2$ platelets using less than 1 weight percent of mixtures on $NH_4SCN$ and $Hg(SCN)_2$. Apparently the platelets would form during the formation of the paracynogen polymer $(CN)_n$. These crystals were smaller and did not have the excellent x-ray detection resolution as the ones produced using styrene and polyethylene.

The usefulness of mercuric iodide in room temperature x-ray spectrometry has been reported and our observation is that the platelets produced by this invention have exceptionally good optical clarity.

Because of the platelet form of the crystal, detector fabrication is simplified to putting contacts on both sides of etched crystals, by painting carbon "(Aquadaq)" or evaporation of thin films of palladium. Thin wires were embedded to the contact areas and the whole crystal was affixed to a ceramic substrate.

Figure 5:
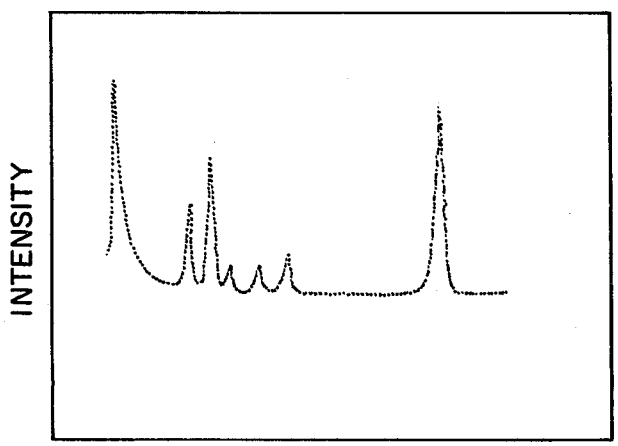
FIG. 5 is a graphic spectra obtained from an AM-241 source and depicts the energy resolution value of a crystal produced with polyethylene.

A spectra obtained from an Am-241 source is shown in FIG. 5. This particular detector was from a polyethylene crystal growth run and had an area of 3 mm$^2$ and was ~100 μm thick. It was biased at 250 volts. Linewidth for the 59.5 keV line is 1.15 keV (FWHM).

Figure 6:
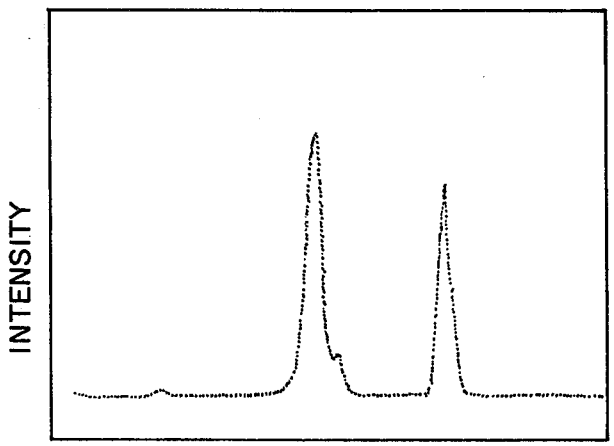
FIG. 6 is a graphic spectra obtained from an AM-241 source and depicts the energy resolution value of a crystal produced with styrene.

An x-ray energy resolution value of 400 ev (FWHM) has been measured for another (styrene) crystal for the Fe-55 keV line. This spectrum is shown in FIG. 6. Electronic noise contribution to this linewidth measured as the width of the pulser line was 300 ev (FWHM). The detector was biased at 250 volts and the shaping time constant used was six microseconds. The electronic systems (without detector) using a specially optimized, room temperature operated FET contributed 260 ev (FWHM) to the linewidth, as corresponds to $HgI_2$.

What is claimed is:

1. A method for vapor phase growth of mercuric iodide crystals, said method comprising the steps of:
   providing an envelope;
   introducing into said envelope a mercuric iodide source material along with an organic transport material that is, at least in part, an organic polymer when subjected to heat sufficient to cause crystal growth in said envelope; and
   providing heat to said envelope to cause crystal growth to occur in said envelope in the presence of said organic polymer therein.

2. The method described in claim 1 wherein said method includes introducing said mercuric iodide source material and said organic transport material into one end of said envelope, sealing said envelope after said mercuric iodide source material and said organic transport material have been introduced into said envelope, and providing said heat to said one end of said envelope with other portions of said envelope being at reduced temperatures relative to said temperature at said one end.

3. The method described in claim 2 wherein the temperature is controlled at said one end of the envelope at not over 500° Centigrade and the temperature at the other end of said tube is maintained at about normal room temperature.

4. The method described in claim 2 including the further step of:
   alternately applying said heat to said one end and to said other portion of said envelope to thereby oscillate the temperature of the source material and the organic transport material thereby causing growth and re-evaporation of a crystal forming in said other portions of said envelope.

5. The method described in claim 4 wherein the organic transport material is styrene.

6. The method described in claim 4 wherein the organic transport material is polyethylene.

7. The method described in claim 4 wherein the steps of heat application are carried out by first heating said one end of the envelope containing the source material to about 230° Centigrade while maintaining the other end of the envelope at near normal room temperature and then, after about a day of normal crystal growth, heating said one end at about 150° Centigrade and simultaneously heating the rest of the envelope at about 230° Centigrade for a few more hours.

8. The method described in claim 7 wherein the temperature oscillation described is repeated whereby platelet crystal yield is increased.

9. Mercuric iodide crystals prepared by the method recited in claim 4.

10. Mercuric iodide crystals prepared by the method recited in claim 4 which are about 1 cm in width and at least 200 microns in thickness.

11. Mercuric iodide crystals prepared by the method recited in claim 1.

12. The method according to claim 1 wherein the mercuric iodide source is reagent grade material.

13. The method described in claim 1 wherein said organic transport material causes crystal growth without introduction of harmful impurities to thereby enable the resulting crystals to be substantially colorless and have excellent optical clarity.

14. Mercuric iodide crystals prepared according to the method recited in claim 1 which are between about 2–3 mm wide and about 1/10 mm in thickness.

* * * * *